US006559698B1

(12) United States Patent
Miyabe

(10) Patent No.: US 6,559,698 B1
(45) Date of Patent: May 6, 2003

(54) SPREAD SPECTRUM TYPE CLOCK GENERATING CIRCUIT

(75) Inventor: Satoru Miyabe, Kyoto (JP)

(73) Assignee: Nippon Precision Circuits, Inc., Tokyo (JP)

(*) Notice: Subject to any disclaimer, the term of this patent is extended or adjusted under 35 U.S.C. 154(b) by 0 days.

(21) Appl. No.: 09/690,551

(22) Filed: Oct. 17, 2000

(30) Foreign Application Priority Data

Oct. 18, 1999 (JP) .......................................... 11-295666

(51) Int. Cl.⁷ .......................... H03L 7/197; H03K 21/02
(52) U.S. Cl. ...................... 327/157; 327/117; 330/1 A; 330/16
(58) Field of Search ................................. 327/156, 157, 327/141, 117, 291; 331/1 A, 16, 28

(56) References Cited

U.S. PATENT DOCUMENTS 4,965,531 A * 10/1990 Riley .......................... 331/1 A
5,631,920 A    5/1997 Hardin ......................... 375/200
6,223,061 B1 * 4/2001 Dacus et al. ................. 455/574

OTHER PUBLICATIONS

M. O. J. Hawksford, "Chaos, Oversampling, and Noise Shaping in Digital–to–Analog Conversion", J. Audio Eng. Soc., Dec. 1989, pp. 980–1001, vol. 37, No. 12.

Tom A. D. Riley, et al., "Delta–Sigma Modulation in Fractional–N Frequency Synthesis", IEEE Journal of Solid State Circuits, May 1993, pp. 553–559, vol. 28, No. 5.

* cited by examiner

Primary Examiner—Dinh T. Le
(74) Attorney, Agent, or Firm—Joel E. Lutzker; Schulte Roth & Zabel, LLP; Donna L. Angotti

(57) ABSTRACT

To restrain cycle-to-cycle jitter in a clock generator subjected to EMI a $2^{nd}$ order PLL having a loop filter including a first capacitor and a first resistor, is provided where a reduction in a comparison frequency is avoided by using a clock modulating circuit. The clock modulation circuit is controlled by an intermediary signal provided by dividing an oscillation signal of a voltage controlled oscillator. The output of the clock modulation circuit is used to recurrently control a divider for dividing the output of the voltage controlled oscillator. Generation of high frequency noise is minimized by using a $1^{st}$ order $\Delta\Sigma$ modulator(21) in the clock modulation circuit. The system behaves like a $3^{rd}$ order PLL due to the presence of a second capacitor having a capacitance value of about 1/10 or more than that of the first capacitor. The second capacitor is placed in parallel with the loop filter to restrain the cycle-to-cycle jitter by effectively removing the high frequency noise.

9 Claims, 4 Drawing Sheets

(fs: Comprison Frequency)

ΔΣ Remaining Quantization Noise $\alpha = C_L / C_s$

SPREAD SPECTRUM TYPE CLOCK GENERATING CIRCUIT

BACKGROUND OF THE INVENTION

1. Field of the Invention

The present invention relates to a clock generating circuit, particularly to a self-modulated type clock generating circuit for spreading the frequency spectrum of an output clock.

2. Description of the Related Art

A conventional clock generating circuit for generating a high-speed clock used in a microprocessor and similar circuits such as a CPU, includes a clock generating circuit that reduces electromagnetic interference (EMI) to peripheral apparatus. One example of such a circuit is a clock circuit disclosed in Japanese Patent Laid-Open No. 235862/1995. The Japanese Patent Laid-Open No. 235862/1995, as shown in FIG. 6, includes a clock modulation circuit 41 for controlling a divider 42. Divider 42 is for dividing an oscillation signal of a voltage controlled oscillator 39 included in a PLL (Phase Locked Loop). The clock modulation is done using an outside reference signal from a quartz oscillation circuit 33. By applying modulation of a low frequency to the clock, power of the clock is not concentrated on a specific single frequency but is spread to a certain constant frequency band to thereby provide an EMI reduction effect. Numeral 35 designates a reference divider for dividing the reference signal of the quartz oscillation circuit 33 and numeral 37 designates a phase frequency comparator for comparing phases of the output of the reference divider 35 and the output of the divider 42. Numeral 38 designates a filter, numeral 41 designates a clock modulation circuit for controlling the divider 42 and numeral 40 designates a buffer for outputting the clock to outside the circuit.

Generally, a PLL circuit receives an external reference signal. The PLL circuit has a voltage controlled oscillator and dividers to divide the reference signal and the oscillation signal from voltage controlled oscillator. Both signals are set to a common frequency referred to as a comparison frequency. An error signal is generated by comparing phases and frequencies of two divided signals. The error signal constitutes a frequency correction signal supplied to the voltage controlled oscillator. The error signal is filtered using a low pass filter referred to as a loop filter before being provided to the voltage controlled oscillator for maintaining the output of the voltage controlled oscillator continuously at a predetermined frequency to generate a high speed clock. The voltage controlled oscillator must continue oscillating without further correction between successive phase frequency comparisons. The longer the period between successive phase frequency comparisons, the wider the deviation becomes from the reference. Therefore, the higher the comparison frequency, i.e., the faster the correction of the voltage controlled oscillator is carried out, the smaller the error and the smaller the correction signal. Conversely, the lower the comparison frequency, the larger the correction signal.

Further, it is known that the main cause of an instantaneous jump phenomenon of the clock frequency which is referred to as cycle-to-cycle jitter of the clock, is a remaining component of the error signal after passing through the loop filter. Therefore, in order to restrain the cycle-to-cycle jitter, it is important to increase the comparison frequency and apply correction before the error is increased.

However, according to the above-described conventional clock generating circuit, the external reference signal is used as the internal clock for operating the clock modulation circuit. In a conventional clock generating circuit for generating a highspeed clock, the frequency of the reference signal is relatively low and a number of clocks generated between successive phase frequency comparisons is small. Therefore, in order to ensure a sufficient number of clock cycles for finishing the processing by the clock modulation circuit prior to the next successive phase frequency comparison, the comparison frequency must be reduced. As a result, the error signal is increased and the cycle-to-cycle jitter is increased.

Further, there has been reported a clock generator for executing fraction division which cannot be dealt with by a divider in a PLL. Such a clock generator uses a $\Delta\Sigma$ modulator of second order or higher to generate a fixed clock having no modulation. In this case, in order for the $\Delta\Sigma$ modulator to reproduce a direct current signal having high resolution, a $\Delta\Sigma$ modulator of second order or higher having noise random performance must be used. As is well known, the $\Delta\Sigma$ modulator has a noise shaping effect and is operated at $\frac{1}{6}$ of an operational frequency or lower to reduce noise and operated at higher than $\frac{1}{6}$ of the operational frequency to increase noise. The higher the order of the $\Delta\Sigma$ modulator, the more increased is the noise at high frequency, i.e., the quantization noise and accordingly, by applying the noise to the PLL, the cycle-to-cycle jitter is increased.

A problem is presented by the conventional systems applying the clock modulation system to a general $2^{nd}$ order PLL. In the $2^{nd}$ order PLL system, a loop filter is constituted by series connection of a first capacitor and a first resistor to the ground. The first capacitor has a capacitance value of $C_L$. $R_L$ designates a resistance value of the first resistor. It is the common practice to connect an additional capacitor having a capacitance value $C_{add}$ sufficiently smaller than the capacitance value $C_L$ of the first capacitor (for example, one fiftieth) in parallel with the loop filter. With the additional capacitor (value $C_{add}$) the system approximates a $2^{nd}$ order PLL system. Here, it is an absolute condition for guaranteeing the stability of the system that the additional capacitor be sufficiently smaller than the first capacitor. That is, the maximum value of phase margin, constituting an index of the stability of the $2^{nd}$ order PLL, is represented as follows by a ratio of the first capacitor to the additional capacitor:

$$\text{Phase margin} = |\tan^{-1}(X/\gamma) - \tan^{-1}(x)| \quad (1)$$

where $\gamma \equiv (C_L / C_{add})$, $X \equiv \omega\tau 1$, $\tau 1 \equiv R_L \cdot C_L$.

Now, consider a case in which the ratio of the first capacitor and the additional capacitor is 1. When the ratio of the first capacitor and the additional capacitor is 1, the maximum possible phase margin becomes zero and such a system cannot be stable. Further, band $\omega 3$ dB of the system that uses the additional capacitor and approximates a $2^{nd}$ order PLL is represented by the following:

$$\omega 3 \text{ dB} = \omega n \cdot \sqrt{(-(2\zeta^2 31\ 1) + \sqrt{((2\zeta^2-1)^2+1))}} \quad (2)$$

where $\omega n = \sqrt{(Ko \cdot Ip/2\pi N\ C_{add})}$, $\zeta = \frac{1}{2}\omega n\tau 2$, notation Ko designates a gain of the voltage controlled oscillator, notation Ip designates a current value of a charge pump, notation N designates a number of divisions performed by the divider, and $\tau 2 = R_L \cdot C_{add}$. These notations apply to the following description.

Almost all of various parameters determining Equation (2) are normally determined by a desired output clock frequency of the clock generating circuit, and $C_{add}$ and $R_L$ remain as adjustable parameters. Varying $C_{add}$ can change $\omega n$ and $\zeta$, whereas varying $R_L$ can only change $\zeta$. Therefore, the band ω3 dB can be adjusted by changing on via adjusting $C_{add}$ while maintaining constant ζ by adjusting $R_L$ such that everything inside of the root sign of Equation 2 is maintained constant. However, as described above, $C_{add}$ is permitted to change relative to $C_L$ only in a small range. Accordingly, even when the ΔΣ modulation method is intended to apply to the $2^{nd}$ order PLL, a PLL band sufficient for removing high-frequency noise generated by the ΔΣ modulator cannot be ensured.

SUMMARY OF THE INVENTION

The present invention includes a $2^{nd}$ order PLL having a loop filter constituted by series connection of a first capacitor and a first resistor to the ground. The PLL of the present invention also includes a clock modulating circuit controlled by a signal obtained by dividing a signal from a high-speed voltage controlled oscillator. The output of the clock modulating circuit is used to recurrently control the divider. This allows the comparison frequency to be maintained high by guaranteeing a number of clock cycles sufficient for the clock modulating circuit to finish processing are provided during a time period between successive phase frequency comparisons. The reduction of the time period between successive phase frequency comparisons results in smaller correction signals which in turn results in cycle-to-cycle jitter being minimized. Generation of high frequency noise causing the cycle-to-cycle jitter is minimized by using a $1^{st}$ order ΔΣ modulator as the clock modulation circuit. The system of the present invention includes a second capacitor having a capacitance value of about ⅟₁₀ or more of that of the first capacitor in parallel with the loop filter. This effectively removes high frequency noise generated by the ΔΣ modulator.

One embodiment of the invention includes a self-modulated type clock generating circuit having a $2^{nd}$ order PLL including a voltage controlled oscillator for generating an external clock signal having a frequency in accordance with an output of a loop filter. The embodiment further includes a divider for dividing the output of the voltage controlled oscillator, converting means for converting an output reference signal into a comparison frequency signal having a predetermined frequency, a phase frequency comparator for comparing phases and frequencies of the output signal of the divider and the comparison frequency signal and generating an error signal that corresponds with the phase frequency error. Also included in the embodiment is a charge pump for generating an electric charge corresponding to the error signal. The embodiment further includes the loop filter having a first capacitor and a first resistor connected in series between an output terminal of the charge pump and a specific potential and a second capacitor connected to the $2^{nd}$ order PLL in order to remove remaining quantization noise provided to the $2^{nd}$ order PLL by a $1^{st}$ order ΔΣ modulator of a clock modulation circuit. The $1^{st}$ order ΔΣ modulator is controlled by a signal derived from the output clock signal. The clock modulation circuit including the $1^{st}$ order ΔΣ modulator controls the number of divisions performed by the divider and thereby spreads the frequency of the output clock.

Further, it is preferable that the second capacitor is provided with a capacitance value of ⅟₁₀ or more of the capacitance value of the first capacitor.

Further, it is also preferable that the self-modulated type clock generating circuit be switched to a fixed clock generating circuit, as needed, by controlling the output of the ΔΣ modulator.

The above and other objects, aspects, features and advantages of the invention will be more readily apparent from the description of the preferred embodiments thereof taken in conjunction with the accompanying drawings and appended claims.

BRIEF DESCRIPTION OF THE DRAWINGS

The invention is illustrated by way of example and not limitation in the figures of the accompanying drawings in which like references denote like or corresponding parts, and in which.

DETAILED DESCRIPTION OF THE PREFERRED EMBODIMENTS

Figure 1:
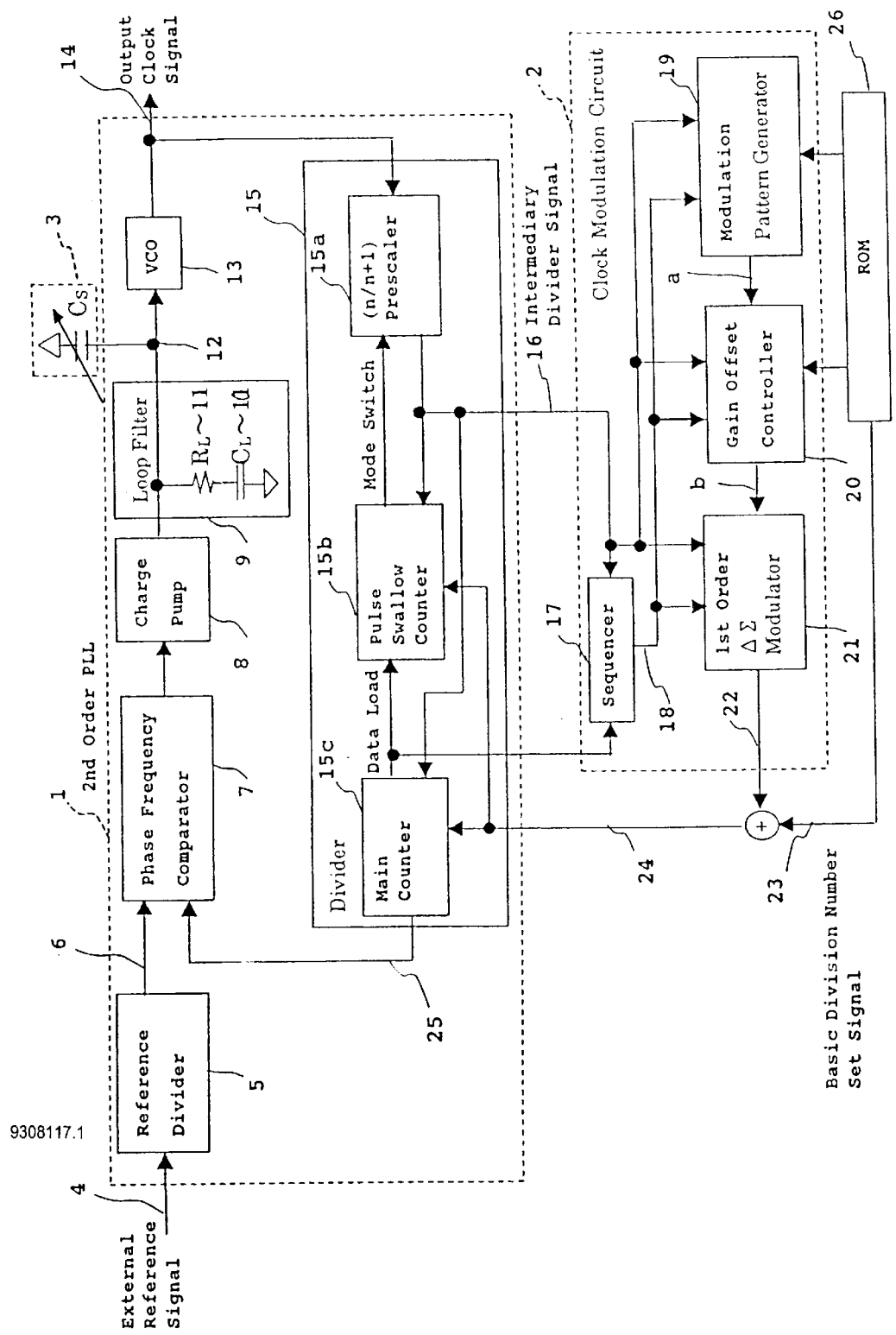
FIG. 1 illustrates a self-modulated type clock generating circuit according to one embodiment of the present invention.

A detailed explanation of embodiments of the invention will be given hereafter with reference to the drawings. FIG. 1 illustrates a clock generating circuit according to the present invention. In FIG. 1, numeral 1 designates a $2^{nd}$ order PLL system including a first capacitor 10, numeral 2 designates a clock modulating circuit and numeral 3 designates a second capacitor $C_S$.

The $2^{nd}$ order PLL system 1 of FIG. 1 includes the following elements designated by the indicated numeral. Numeral 4 designates an external reference signal and numeral 5 designates a reference divider (a frequency multiplier may be used as necessary) for dividing the reference signal and generating a reference divider signal 6 as a comparison frequency signal having a predetermined comparison frequency. Numeral 7 designates a phase frequency comparator for comparing phases and frequencies of the reference divider signal 6 and a divider signal from a divider 15 (described later) and generating an error signal corresponding to the phase frequency mismatch between the two divider signals. Numeral 8 designates a charge pump for generating an electric charge in an amount corresponding to the error signal. Numeral 9 designates a loop filter having the first capacitor 10 and a first resistor 11. Numeral 12 designates an output terminal of the loop filter. Further, the capacitor 10 and the resistor 11 included in the loop filter 9 are connected in series with each other and connected to the ground or a power source terminal. The second capacitor 3 is connected between the output terminal 12 of the loop filter and the ground or a power source terminal. Further, the loop filter 9 may include (not shown in FIG. 1) an additional resistor or an additional capacitor. Further, the loop filter 9 may be constituted to be active. In this case, the first capacitor 10 and the first resistor 11 are connected in series with each other and connected to virtual ground or virtual bias power source and the second capacitor 3 is also connected to the virtual ground or the virtual bias power source. Numeral 13 designates a voltage controlled oscillator for generating an output clock signal 14 having a frequency in accordance with an output signal from the output terminal 12 of the loop filter. Numeral 15 designates a divider for dividing the output clock signal 14 and is constituted by an n/(n+1) prescaler 15a generating an intermediary divider signal 16, a pulse swallow counter 15b and a main counter 15c. The n/(n+1) prescaler 15a can perform divisions in accordance with a mode switch signal, i.e., the n/(n+1) prescaler 15a can switch the number of divisions to n or n+1 depending upon the mode switch signal. The main counter 15c is a down counter for counting down a set value, i.e., the number of divisions and generates a data load signal after finishing one set of counting operations and then repeats the cycle. In the case of a divider which does not use a prescaler, an intermediary divider signal 16 is constituted by an output from a pertinent division stage of the divider.

The clock modulating circuit 2 includes a sequencer 17, a modulation pattern generator 19 receiving a timing signal 18 from the sequencer 17, a gain offset controller 20 and a $1^{st}$ order $\Delta\Sigma$ modulator 21. An output signal 22 from the $1^{st}$ order $\Delta\Sigma$ modulator 21 is added to a basic division number set signal 23 to constitute an added signal 24 which is used as a set value of the divider 15. That is, a basic division number N from the basic division number set signal 23 is added with $\Delta N$ from the output signal 22, $\Delta N$ being the modulation value. The main counter 15c is loaded with the added signal 24 as a set value, counts down the division number indicated by the set value and thereby the divider 15 generats a divider signal 25 by dividing the output clock signal 14. The basic frequency set signal 23 is read from ROM 26. The clock modulation pattern, gain and offset are provided to ROM 26 as data and generated by simple processing for later adjustment.

Next, an explanation will be given of basic PLL operation with reference to FIG. 1. The external reference signal 4 is divided by the reference divider 5 and is converted into the reference divider signal 6. The reference divider signal 6 is inputted to the phase frequency comparator 7 along with the divider signal 25. The phase frequency comparator detects a phase frequency error between the reference divider signal 6 and the divider signal 25. An error signal output from the phase frequency comparator 7 is transmitted to the charge pump 8, converted into an electric charge in an amount proportionate to the phase frequency error which in turn is transmitted to the loop filter 9. As a result, the output signal from the loop filter output terminal 12 is changed in accordance with the phase frequency error and changes the voltage controlled oscillator output 14 in a direction of reducing the phase frequency error. The voltage controlled oscillator output 14 adjusted in this manner is inputted to the divider 15 and the divider signal 25 is compared with the reference divider signal 6 to generate an error signal and in turn compensate for the phase frequency error. By repeating the above-described series of operations, the output signal 14 from the voltage controlled oscillator can be maintained continuously at a certain phase and frequency. At that point, the reference divider signal 6 and the divider signal 25 have a frequency referred to as the comparison frequency.

Figure 2A:
FIGS. 2A, 2B, 2(22) and 2(12) are waveform diagrams for explaining operation of portions of the clock modulation circuit in FIG. 1.
Figure 2B:
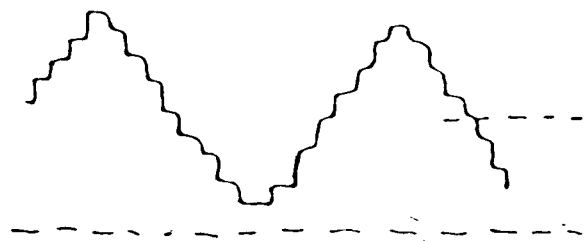
Figure 2:
Figure 2:

Next, an explanation of the relationship between the divider 15 and the clock modulation circuit 2 is described with reference to FIG. 1. When the divider 15 has finished one set of down counting operation, the divider 15 updates setting of the number of divisions and starts the next down counting operation. The divider 15 transmits the intermediary divider output signal 16 from the prescaler 15a to the sequencer 17. The sequencer 17 generates the timing signal 18 necessary for the clock modulation circuit 2 using the intermediary divider output signal 16. The clock modulating circuit 2 is provided with the $1^{st}$ order $\Delta\Sigma$ modulator 21 at its output stage which adds quantization noise mainly of high frequency to a predetermined digital modulation signal produced by the clock modulation pattern generator 19 and the gain offset controller 20. This reduces the number of bits of the digital modulation signal. For example, a digital triangular wave shown by FIG. 2A is outputted from the clock modulation pattern generator 19, the digital triangular wave signal is provided with gain and offset as shown by FIG. 2B by the gain offset controller 20. Thereafter, output of gain offset controller 20 is $\Delta\Sigma$ modulated by the $1^{st}$ order $\Delta\Sigma$ modulator 21 to output signal 22 which is a digital signal as shown in FIG. 2(22) having a number of quantization steps smaller than that in FIG. 2B. The output signal 22 is added with the basic division number set signal 23 and the divider 15 sets the number of divisions based on the added signal 24. The above-described series of operation is carried out recurrently with respect to the divider 15. Thereby, very small fluctuation can be given to the basic division number set signal 23. That is, fluctuation of +1.5% or 0.5% for the basic division number which cannot be produced otherwise (since fraction division cannot otherwise be executed by divider 15 due to a deficiency in the number of bits) is realized when the basic division number set signal 23 is modulated by output signal 22 (the modulation data rounded to a small bit number) having out of band quantization noise. Thereby, as shown in FIG. 2 (12), a signal at the terminal 12 is slightly fluctuated and the frequency of the output clock signal is spread.

Further, by pertinently adjusting the intermediary divider output signal 16, the timing signal 18 having a sufficient period (i.e., clock cycles) necessary for the clock modulation circuit 2 can be generated. Therefore, there is no need of reducing the comparison frequency due to the time period required for generating the timing signal of the clock modulation circuit 2 and the EMI reduction can be realized by the clock modulation effect while avoiding the reduction in the comparison frequency causing cycle-to-cycle jitter.

Figure 3:
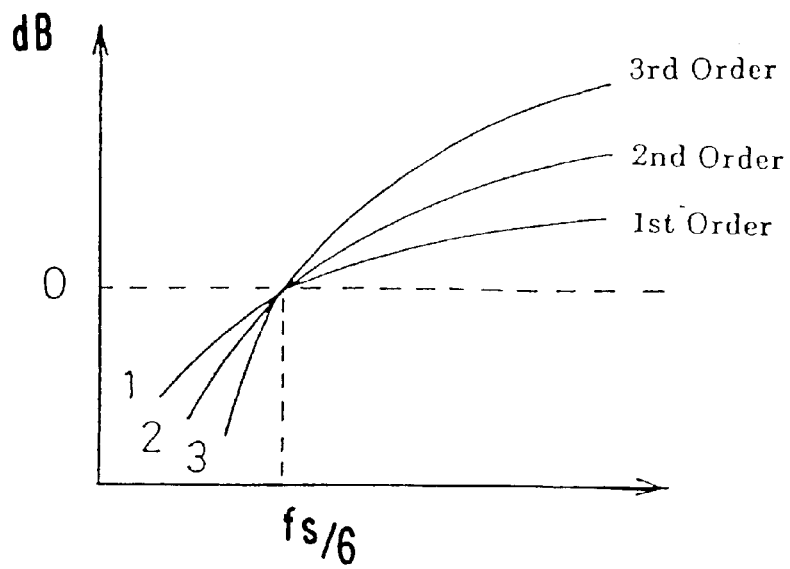
FIG. 3 is a plot of comparison frequency versus loss or gain in dB for the ΔΣ modulator of FIG. 1.

Further, the $1^{st}$ order $\Delta\Sigma$ modulator 21 used in the clock modulation circuit 2 is used with the purpose of intentionally giving fluctuation to the clock frequency of the output clock signal 14. Such $\Delta\Sigma$ modulator does not require high resolution different from the case of carrying out direct current control and therefore, the $\Delta\Sigma$ modulator of the first order can be used. For a first order $\Delta\Sigma$ modulator, as shown by FIG. 3, quantization noise at high frequency is smaller than that of a second or a third order $\Delta\Sigma$ modulator. Thus, generation of the quantization noise having a high frequency that causes cycle-to-cycle jitter can be minimized by use of a first order $\Delta\Sigma$ modulator. The cannot be produced otherwise (since fraction division cannot otherwise be executed by divider 15 due to a deficiency in the number of bits) is realized when the basic division number set signal 23 is modulated by output signal 22 (the modulation data canceled to a small bit number) having out of band quantization noise. Thereby, as shown in FIG. 2 (12), a signal at the terminal 12 is slightly fluctuated and the frequency of the output clock signal is spread.

Further, by pertinently adjusting the intermediary divider output signal 16, the timing signal 18 having a sufficient period (i.e., clock cycles) necessary for the clock modulation circuit 2 can be generated. Therefore, there is no need of reducing the comparison frequency due to the time period required for generating the timing signal of the clock modulation circuit 2 and the EMI reduction can be realized by the clock modulation effect while avoiding the reduction in the comparison frequency causing cycle-to-cycle jitter.

Further, the $1^{st}$ order ΔΣ modulator 21 used in the clock modulation circuit 2 is used with the purpose of intentionally giving fluctuation to the clock frequency of the output clock signal 14. Such ΔΣ modulator does not require high resolution different from the case of carrying out direct current control and therefore, the ΔΣ modulator of the first order can be used. For a first order ΔΣ modulator, as shown by FIG. 3, quantization noise at high frequency is smaller than that of a second or a third order ΔΣ modulator. Thus, generation of the quantization noise having a high frequency that causes cycle-to-cycle jitter can be minimized by use of a first order ΔΣ modulator. The quantization noise is in a frequency band higher than the modulation signal band and accordingly, the quantization noise can be removed by properly adjusting the PLL as mentioned below.

Following is a description of the second capacitor 3 (capacitance value Cs) and an explanation of the use of the second capacitor 3 for removing high-frequency noise generated by the $1^{st}$ order ΔΣ modulator 21. When Cs is about 1/10 or more of the capacitance value $C_L$ of the first capacitor 10, the PLL system including the second capacitor 3 cannot be approximated by a $2^{nd}$ order system but must be dealt with as a $3^{rd}$ order system. For a third order system Cs must be understood as a parameter different from the capacitance value $C_{add}$ which is sufficiently smaller than $C_L$. Phase margin of the $3^{rd}$ order PLL is shown by the following equation.

$$\text{Phase margin} = |\tan^{-1}(X/(\alpha+1)) - \tan^{-1}(x)| \quad (3)$$

where $\alpha \equiv (C_L/Cs)$, $X \equiv \omega\tau 1$, $\tau 1 \equiv R_L \cdot C_L$.

As is apparent from Equation (3), in the case of the third order PLL, even when $Cs = C_L$, the maximum phase margin does not become zero and the system is not necessarily unstable. The stability of a system for a fixed clock generator and the stability of a system for a modulation type clock generator do not have to be of the same degree. The system for a modulation type clock generator is sufficiently stable even when $Cs = C_L$.

For a third order PLL, band ω3 dB is represented by the following equation:

$$\omega 3 \text{ dB} = \sqrt{(2\sqrt{(-p)} \times \cos((1/3) \cdot \cos^{-1}(-q/(2\sqrt{(-p^3)}))) - (a/3))} \quad (4)$$

where $p \equiv -(a^3/9) + (b/3)$, $q \equiv (2a^3/27) - (ab/3) + c$, $a \equiv (\alpha+1)(N(\alpha+1) - 2\tau 1^2 A)/(\tau 1^2 N)$, $b \equiv -(\alpha+1)^2 A(A\tau 1^2 + 2N)/(\tau 1^2 N^2)$, $C \equiv -(\alpha+1)^2 A^2/(\tau 1^2 N^2)$, $A \equiv Ko \cdot Ip/(2\pi C_L) \times (\alpha/(\alpha+1))$.

Figure 4:
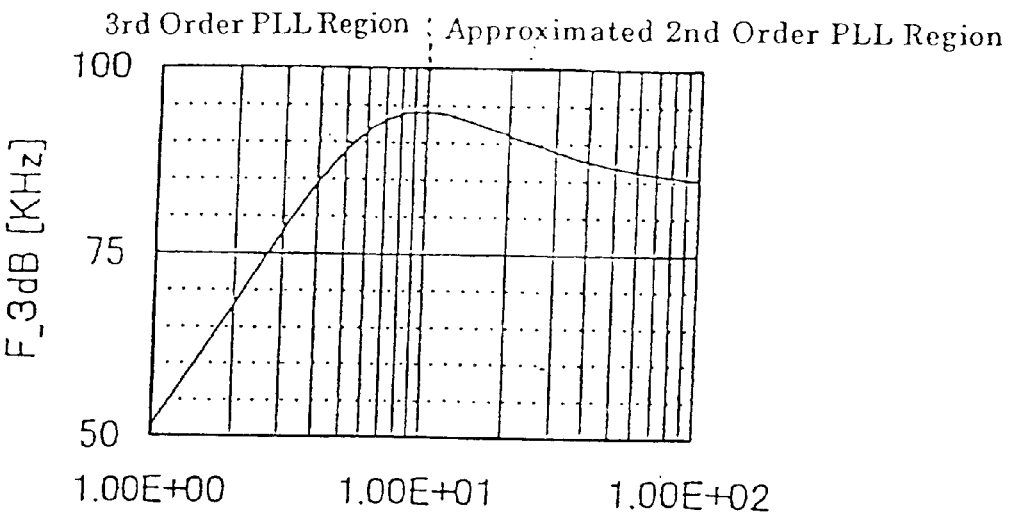
FIG. 4 is a plot of bandwidth of the PLL of FIG. 1 versus alpha ($C_L/C_S$)
Figure 6:
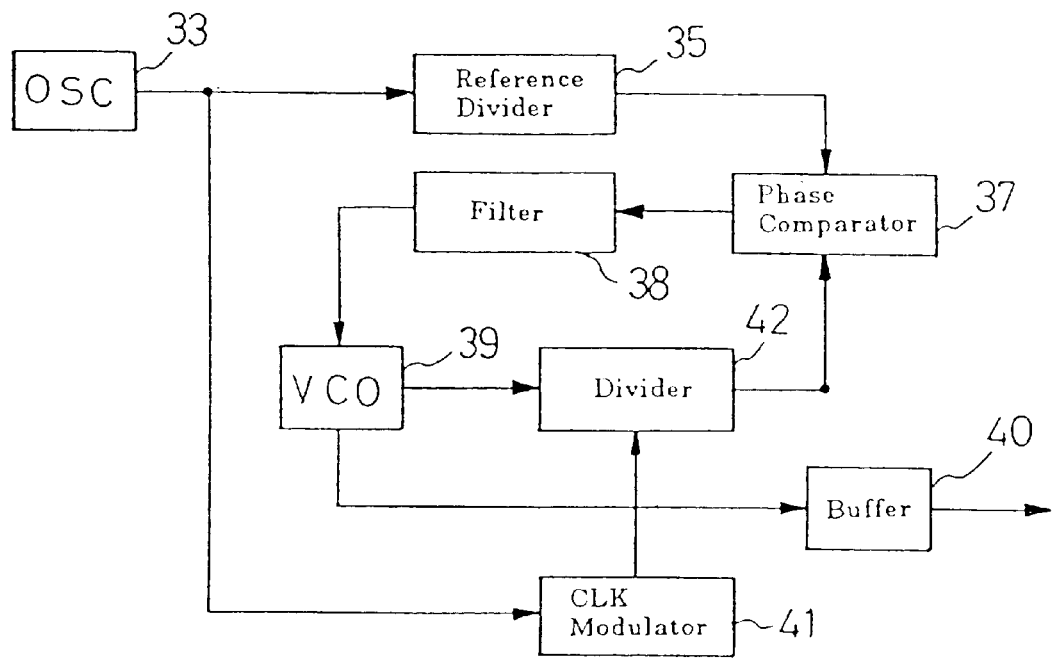
FIG. 6 illustrates a conventional clock generating circuit.
Figure 5:
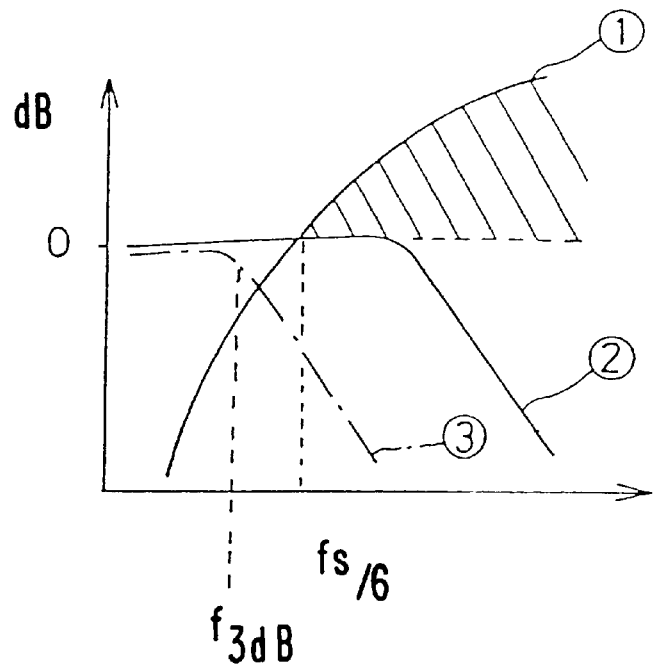
FIG. 5 is a plot of frequency versus loss or gain in dB for the PLL of FIG. 1.

FIG. 4 is a plot of ω3 dB versus alpha obtained by giving typical design values to Equation (4). As is apparent from FIG. 4, in a region having a large ratio of $C_L/Cs$, that is, a region which can be approximated by a $2^{nd}$ order PLL since Cs is sufficiently smaller than $C_L$, there is no capability of adjusting the band by varying Cs. Meanwhile, in a region having a small ratio of $C_L/CS$, that is, in a region in which Cs is about 1/10 or more of $C_L$, Cs may be varied to adjust the band. Therefore, by using the second capacitor 3 having the capacitance value Cs of about 1/10 of $C_L$, band adjustment necessary for removing the high frequency noise generated in the $1^{st}$ order ΔΣ modulator can be carried out. A specific description with reference to FIG. 5 follows. A noise characteristic of the $1^{st}$ order ΔΣ modulator is shown in FIG. 5, curve 1. The noise characteristic of the PLL before adjustment, i.e. the $2^{nd}$ order PLL, is illustrated by curve 3 (FIG. 5) and the noise characteristic of the PLL after adjustment, that is, the 3rd order PLL, is illustrated by curve 2 (FIG. 5). As shown in FIG. 5, a noise component which cannot be removed by the $2^{nd}$ order PLL is removed by setting PLL band f3 dB to 1/6 or smaller of the comparison frequency fs by adjusting Cs.

A description of the stability of a third order PLL with clock modulation follows. In a clock generator in which restraint of cycle-to-cycle jitter is important, there is no problem due to fluctuation of the clock frequency at low frequency referred to as long term jitter. This enables the clock modulation by low frequency. Meanwhile, fluctuation at low frequency is generated in the PLL output by a reduction in phase margin in the $3^{rd}$ order PLL and the remainder of a component having a comparatively low inner noise of the PLL since a negative feedback region is narrowed by narrow band formation. However, the fluctuation at low frequency does not cause cycle-to-cycle jitter which is an instantaneous frequency jump. Further, such a low fluctuation component is smaller than the clock modulation signal intentionally applied and does not deteriorate the clock characteristic of the modulation type clock generator.

Further, for the same reason described above, in a fixed clock generator where cycle-to-cycle jitter is important, the above described $3^{rd}$ order PLL system can be used as a fixed clock generator when the $1^{st}$ order ΔΣ modulator 21 is stopped or brought into a zero output state.

Further, the fixed clock generator and alternatively the modulation type clock generator can be realized by switching control of the output value of the $1^{st}$ order ΔΣ modulator 21 and without switching constants in the PLL.

According to the invention, the clock generating circuit providing reduction in electromagnetic interference (EMI) includes a $2^{nd}$ order PLL 1 having a loop filter 9 constituted by series connection of a first capacitor 10 and a first resistor 11 to specific potential (ground or power source, or virtual ground or virtual bias power source). The circuit also includes a $1^{st}$ order ΔΣ modulator 21 controlled by the intermediary divider signal 16 provided by dividing the oscillation signal 14 of the voltage controlled oscillator 13 in the PLL 1. Also included in the circuit is a divider 15 that is recurrently controlled by an added signal 24 and a second capacitor 3 having the capacitance value of about 1/10 or more of that of the first capacitor 10 to reduce the cycle-to-cycle jitter.

Although the invention has been described with reference to the preferred embodiments, it will be apparent to one skilled in the art that variations and modifications are contemplated within the spirit and scope of the invention. The drawings and description of the preferred embodiments are made by way of example rather than to limit the scope of the invention, and it is intended to cover within the spirit and scope of the invention all such changes and modifications.

What is claimed is:

1. A spread spectrum clock generating circuit comprising:
    a $2^{nd}$ order PLL including a voltage controlled oscillator for generating an output clock signal having a frequency in accordance with an output of a loop filter, a divider for dividing an output of the voltage controlled oscillator, converting means for converting an external reference signal into a comparison frequency signal having a predetermined frequency, a phase frequency comparator for comparing phase and frequencies of an output signal of the divider and the comparison frequency signal and generating an error signal in correspondence with a phase frequency error, a charge pump for generating an electric charge amount in accordance with the error signal and the loop filter comprising a first capacitor and a first resistor connected in series between an output terminal of the charge pump and a specific potential;

a clock modulation circuit being controlled based on the output clock signal of said spread spectrum clock generating circuit, and including a $1^{st}$ order $\Delta\Sigma$ modulator for recurrently controlling a number of divisions of the divider and for spreading a frequency of the output clock signal; and a second capacitor connected in parallel to the loop filter in order to remove remaining quantization noise provided to the $2^{nd}$ order PLL by the $1^{st}$ order $\Delta\Sigma$ modulator, and to approximate the $2^{nd}$ order PLL to a $3^{rd}$ order PLL.

2. The spread spectrum clock generating circuit according to claim 1, wherein the second capacitor is provided with a capacitance value of 1/10 or more of a capacitance value of the first capacitor.

3. The spread spectrum clock generating circuit according to claim 1, wherein the spread spectrum clock generating circuit is switched to a fixed clock generating circuit as needed by controlling an output value of the $\Delta\Sigma$ modulator.

4. The spread spectrum clock generating circuit according to claim 3, wherein spread spectrum clock generating circuit is switched to said fixed clock generating circuit outputting a fixed frequency clock signal, said fixed frequency clock signal, having a spectrum that is not spread by stopping an output signal of said $1^{st}$ order $\Delta\Sigma$ modulator or by bringing an output state of said $1^{st}$ order $\Delta\Sigma$ modulator to zero.

5. A spread spectrum clock generating circuit comprising:

a phase locked loop receiving a reference signal and generating an output clock signal; and a clock modulation circuit controlled by a signal derived from the output clock signal for spreading a frequency spectrum of the output clock signal of said spread spectrum clock generating circuit and including a first-order $\Delta\Sigma$ modulator;

said phase locked loop comprising:

a voltage controlled oscillator;

a divider for dividing the output of said voltage controlled oscillator in said phase locked loop wherein said clock modulation circuit controls a division number of said divider;

a loop filter and noise capacitor connected in parallel to said loop filter to remove quantization noise caused by said $1^{st}$ order $\Delta\Sigma$ modulator; and wherein said phase locked loop is of the second order and the value of said noise capacitor can be selected such that said phase locked loop has characteristics of a third order phase locked loop.

6. The spread spectrum clock generating circuit according to claim 5, further comprising said loop filter comprising a filter capacitor and a resister, and wherein said noise capacitor is provided with a capacitive value of 1/10 or more of a capacitive value of said filter capacitor.

7. The spread spectrum clock generating circuit according to claim 5, wherein said noise capacitor is a variable capacitor.

8. The spread spectrum clock generating circuit according to claim 5, wherein an output value of said $1^{st}$ order $\Delta\Sigma$ modulator switches the spread spectrum clock generating circuit to a fixed clock generating circuit.

9. A method of generating a spread spectrum clock signal with reduced electromagnetic interference comprising:

generating an output clock signal by phase locking the output clock signal to a reference signal;

controlling a clock modulation circuit with a signal derived from the output clock signal for spreading a frequency spectrum of the output clock signal, and the clock modulation circuit using a $1^{st}$ order $\Delta\Sigma$ modulator;

setting recurrently a division number in a divider via a signal obtained from the clock modulation circuit;

varying the division number by a fractional amount;

using the $1^{st}$ order $\Delta\Sigma$ modulator to accomplish fractional division;

removing quantization noise and reducing cycle-cycle jitter by connecting a noise capacitor in parallel to a loop filter included in a phase locked loop for performing the phase locking; and wherein said phase locked loop is of the second order and the value of said noise capacitor can be selected such that said phase locked loop has characteristics of a third order phase locked loop.

* * * * *